United States Patent
Green et al.

(10) Patent No.: US 7,403,089 B2
(45) Date of Patent: Jul. 22, 2008

(54) MAGNET ASSEMBLIES

(75) Inventors: Gordon R Green, S. Glos. (GB);
Robert K Trowell, S. Glos. (GB)

(73) Assignee: Aviza Technology Limited, Newport, Gwent (GB)

( * ) Notice: Subject to any disclaimer, the term of this patent is extended or adjusted under 35 U.S.C. 154(b) by 101 days.

(21) Appl. No.: 11/006,634

(22) Filed: Dec. 8, 2004

(65) Prior Publication Data

US 2005/0134418 A1 Jun. 23, 2005

Related U.S. Application Data

(60) Provisional application No. 60/531,622, filed on Dec. 23, 2003.

(51) Int. Cl.
*H01F 5/00* (2006.01)
(52) U.S. Cl. .................. 335/299; 335/296; 335/306
(58) Field of Classification Search .............. 204/192.2, 204/298.15–16; 335/302–306, 296–299
See application file for complete search history.

(56) References Cited

U.S. PATENT DOCUMENTS

| | | | |
|---|---|---|---|
| 5,433,812 A * | 7/1995 | Cuomo et al. .......... | 156/345.48 |
| 5,589,039 A * | 12/1996 | Hsu .................... | 204/192.12 |
| 5,630,916 A | 5/1997 | Gerrish et al. | |
| 5,858,180 A * | 1/1999 | Hsu .................... | 204/192.12 |
| 6,042,707 A | 3/2000 | Moslehi et al. | |
| 6,249,200 B1 * | 6/2001 | Stelter et al. ............. | 335/302 |
| 6,369,479 B1 * | 4/2002 | Ochiai et al. ............ | 310/156.51 |
| 6,496,092 B1 * | 12/2002 | Schnatterer et al. ......... | 335/220 |
| 6,545,580 B2 | 4/2003 | Hegde et al. | |
| 6,579,421 B1 * | 6/2003 | Fu ....................... | 204/192.12 |
| 6,608,539 B2 * | 8/2003 | Nobutoki et al. .......... | 335/78 |

FOREIGN PATENT DOCUMENTS

| | | | |
|---|---|---|---|
| GB | 2 343 199 A | | 5/2000 |
| JP | 05251227 A | * | 9/1993 |
| WO | WO 99/53506 | | 10/1999 |
| WO | WO 00/14768 | | 3/2000 |
| WO | WO 2004/022238 A3 | | 3/2004 |

\* cited by examiner

*Primary Examiner*—Elvin Enad
*Assistant Examiner*—Bernard Rojas
(74) *Attorney, Agent, or Firm*—Volentine & Whitt, PLLC

(57) ABSTRACT

This invention relates to magnetic assemblies and, in particular, to assemblies which are useful for inducing magnetic fields within vacuum chambers. Thus a magnetic assembly, generally indicated at 10, includes the rectangular magnetically soft core 11 carrying windings 12, which together form the main planar electromagnet, generally indicated at 13, and immediately adjacent the edges of the magnet 13 are placed auxiliary coils 14. Coils 14 are each formed from windings 15 wound around oblate cores 16 and it would be noted that they project upwardly above the upper surface of the planar magnet 13. Pole pieces 17 are attached to the ends of the planar magnet 13 and these two project above the upper surface of the planar magnet 13. The assembly is completed by mounting brackets 18.

11 Claims, 4 Drawing Sheets

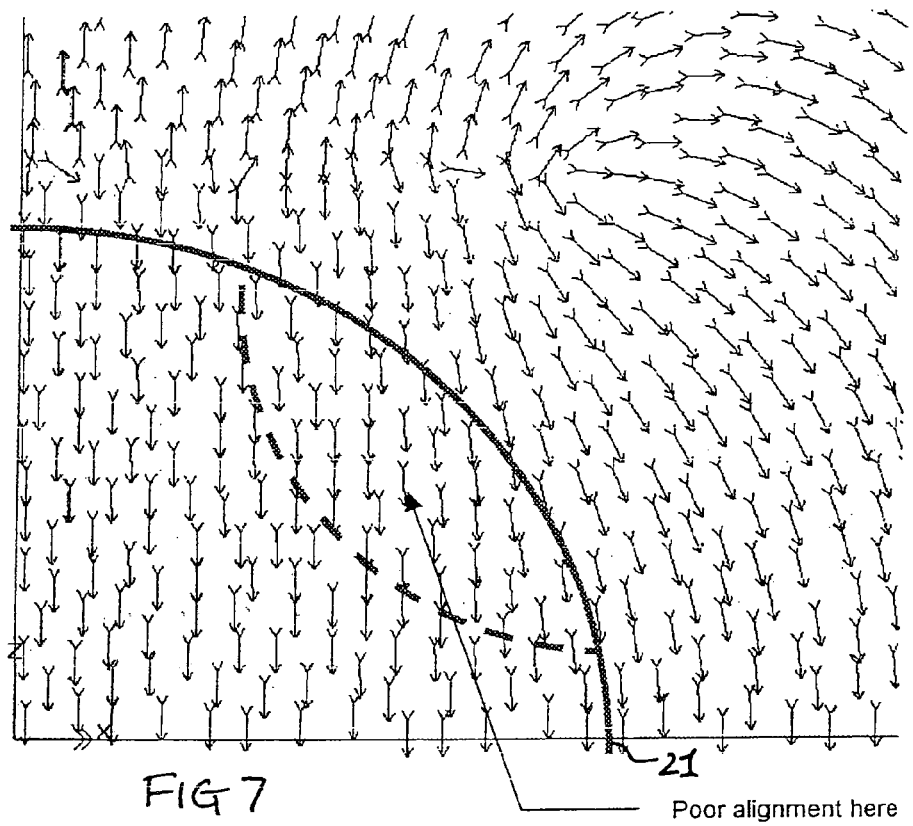
No auxiliary coil  FIG 7  Poor alignment here
With auxiliary coil – good alignment over entire wafer
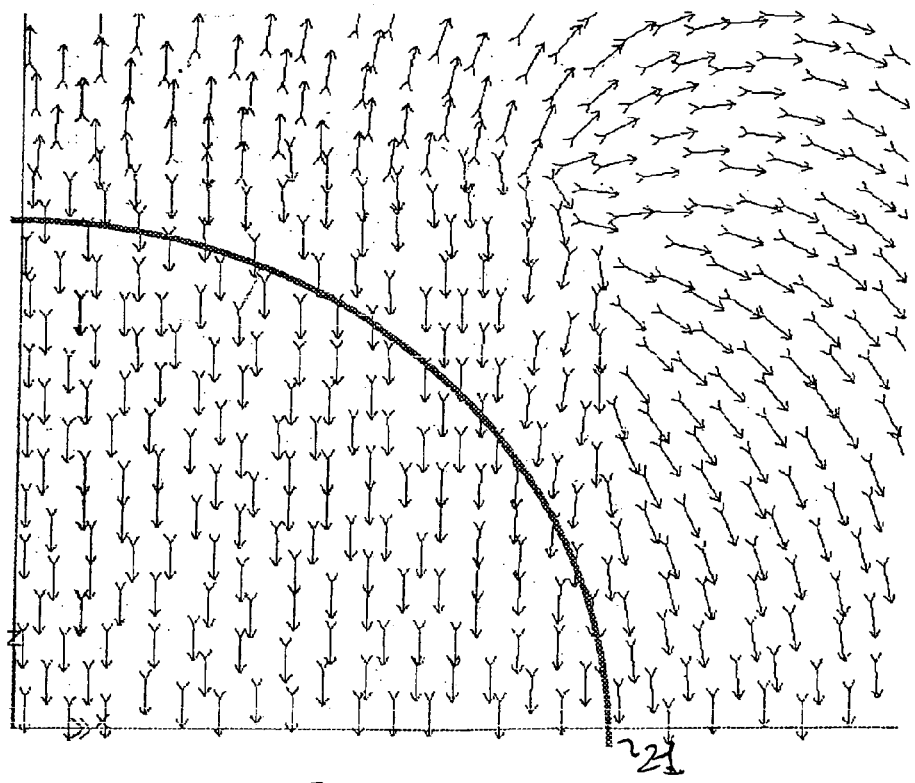
FIG 8

MAGNET ASSEMBLIES

CROSS REFERENCE TO RELATED APPLICATIONS

A claim to priority is made to U.S. Provisional Application 60/531,622 filed Dec. 23, 2003.

BACKGROUND OF INVENTION

1. Field of Invention

This invention relates to magnet assemblies and particularly assemblies which are useful for inducing magnetic fields within vacuum chambers.

2. Background of Invention

In the fabrication of thin film magnetic devices—sensors, magnet heads, MRAM magnetic materials are often deposited by sputtering. During such processes, it is also, frequently, a requirement that a magnetic field is applied to the substrate so that the resulting films are magnetically aligned. It will be appreciated, therefore, that if the magnetic field across the substrate is not completely aligned, problems of non-uniformity will arise.

Considerable thought therefore has been given to the design of magnetic field generators for use in connection with vacuum deposition systems. Although either permanent magnets or electromagnetics can be used, the latter are preferred, because they can be switched on or off or otherwise modulated. Typical field strengths are in the range of 4 to 8 kA.m$^{-1}$. For thin film applications, the component of the magnetic field perpendicular to the growing film is generally of no concern. However alignment of the in plane film needs to be typically no more than +/−2° over the area of the substrate as in plane non-uniformity is often required to be less than +/−5%.

Whilst large coils placed externally on opposite sides of the vacuum chamber, might well provide the necessary configuration, they are very bulky and require high power and only provide a magnetic field in a single plane or direction.

It is generally preferred to mount the field generator in close proximity to the substrate support. The approaches generally fall into two types. The first has two opposing pole pieces, connected by a low reluctance magnetic circuit incorporating one or more coils, which can be located beneath or adjacent to the substrate support. The disadvantage of this approach is that the pole pieces must lie in, or very close, to the plane of the substrate. They must also extend laterally well beyond the substrate in order to project an acceptably uniaxial field across the substrate. They thus encompass a relatively large rectangular space surrounding the substrate and this can interfere with other hardware within the process environment. Such a configuration is shown in FIG. 1.

A development of this approach is shown in U.S. Pat. No. 6,545,580. It will be noted that in order to achieve acceptable field alignment, additional L-shaped "pole pieces" are required. Since these must be located at or close to the plane of the substrate, much of the advantage of the upward projection is lost.

The second approach is illustrated in U.S. Pat. Nos. 5,630,916 and U.S. Pat. No. 6,042,707, which aim to project a field from below the substrate support. They utilise a generally planar coil—i.e. a coil wound around a soft magnetic core in the form of a flat plate. The weakness of the planar coil approach, as described in U.S. Pat. No. 5,630,916, is illustrated in FIG. 2, which is that the coil must extend significantly beyond the edge of the substrate, if uniformity over the substrate is to be maintained. In U.S. Pat. No. 5,630,916 it is stated that the coil should be at least 50% larger than the substrate in order to achieve acceptable field uniformity.

SUMMARY OF THE INVENTION

From one aspect the applicants invention consists in a magnetic assembly comprising, or for providing the magnetic equivalent of, an electromagnet having U-shaped windings to generate a uniform magnetic field extending between the arms of the U and parallel to the base thereof.

The applicants have realised that by having such a configuration a uniform field can be generated, but without the electromagnet needing to be dimensionally much greater than the dimension of the planar coil, so that the electromagnet can sit readily within conventional support structures. Using current technology, it is probably impractical to provide an electromagnet with U-shaped windings on a commercial basis and the applicants have further appreciated that the equivalent can be constituted by a generally planar electromagnet and a pair of auxiliary coils disposed adjacent respective edges of the windings of the planar electromagnet to project beyond one face of the planar electromagnet.

The auxiliary coils would preferably have respective magnetically soft cores and, in use, should be arranged such that the current flowing in adjacent sections of the windings of the electromagnet and the respective auxiliary coils are in the opposite direction. This not only puts the current flow in the correct direction in respect of the projecting portions of the auxiliary coils, it also means that the fields generated by the edge of the planar electromagnetic windings are substantially cancelled or compensated for.

The auxiliary coils and/or the electromagnet may be independently powered and means may be provided for tuning the auxiliary coils, for example by adjusting the number of active coils in the auxiliary windings, e.g. by using appropriate tapping points, and/or by varying the current through the respective coils.

From another aspect the invention consists in apparatus for generating a substantially uniform magnetic field across a planar location for a planar workpiece including a generally planar electromagnet locatable beneath the location and parallel thereto and a pair of auxiliary coils disposed adjacent respective edges of the windings of the generally planar magnet for creating a magnetic field in opposition to the magnetic field generated in use by the associated edges of the windings of the electromagnet.

Preferably the auxiliary coils project beyond the face of the generally planar electromagnet. The electromagnet and respective auxiliary coils may be independently powered and additionally or alternatively the auxiliary coils may include tapping points or other arrangements for varying the active number of windings in them.

From a still further aspect the invention consists in a planar workpiece apparatus including a vacuum chamber, a support for a workpiece located in the chamber to support the workpiece in a generally planar workpiece location and an assembly as claimed in claims 1 to 7 or a magnetic field generating apparatus as claimed in claims 8 to 10 disposed external to the chamber adjacent the support to generate a uniform magnetic field through the location in the plane of the location.

BRIEF DESCRIPTION OF THE DRAWINGS

The invention may be performed in various ways and specific embodiments will now be described by way of example, with reference to the accompany drawings, in which:

FIG. 7 is a print-out from a mathematical model modelling the in plane field generated by the FIG. 3 arrangement; and FIG. 8 is the equivalent print-out to FIG. 7 for the FIG. 4 arrangement.

DETAILED DESCRIPTION OF THE PREFERRED EMBODIMENTS

Figure 1:
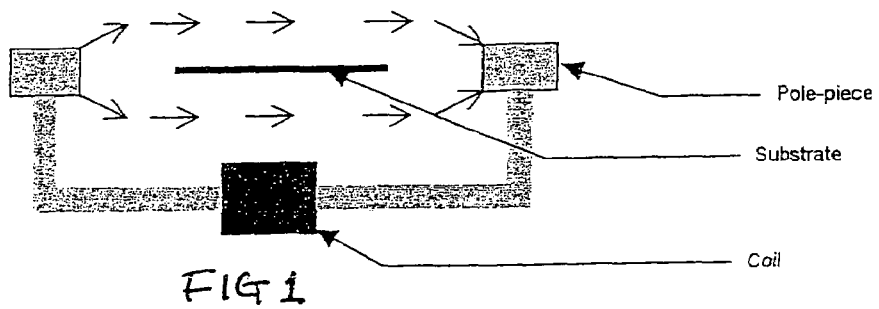
FIG. 1 is a schematic side view of a prior art configuration.
Figure 2:
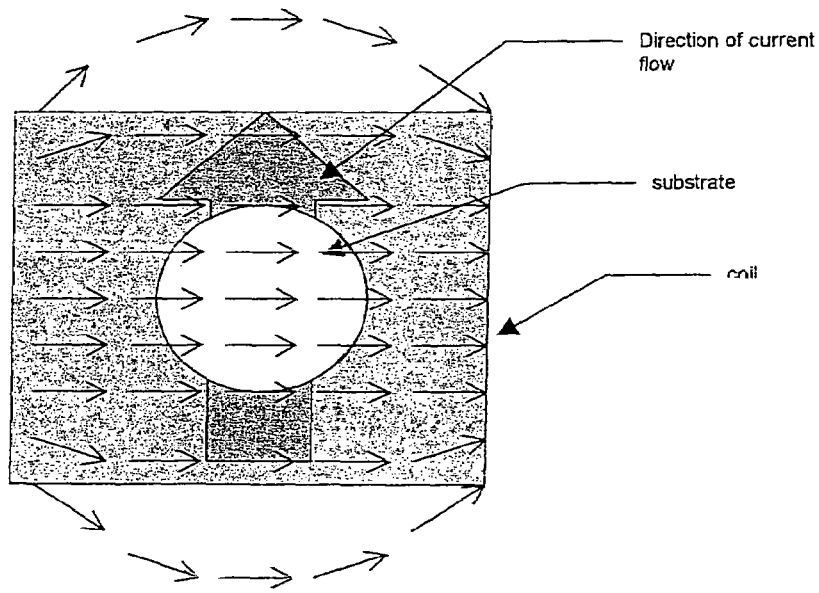
FIG. 2 is a schematic plan view of the configuration of FIG. 2.
Figure 3:
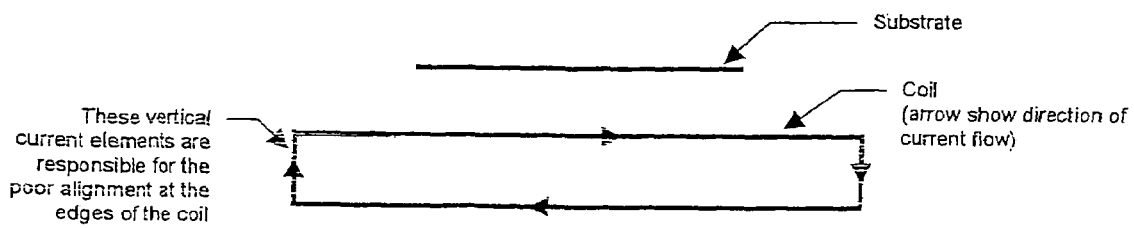
FIG. 3 is a schematic view of an alternative prior art arrangement.

Returning to the diagram in FIG. 2, it is evident from the Biot-Savart Law that current flowing upwards in the plane of the page, as indicated, cannot produce components of magnetic field in a parallel direction. Thus the looping field lines found in proximity to the upper and lower edges of the coil cannot have their origin in the current plane formed by the upper windings of the coil. Stated another way, if the current plane could terminate abruptly just beyond the edge of the substrate, then the resulting field would be perfectly aligned at the plane of the page. However, this is not practicably possible. The current must pass into and out of the plane of the page in order to make a closed circuit with the parallel returning path beneath. This arrangement is illustrated in FIG. 3 and the vertical return paths, which enable the current to flow through the planar parts of the windings, are the source of the unwanted looping field which creates the poor alignment. One approach to overcoming this would to be to make these vertical paths very small, but practically this would result in a loss of mechanical rigidity; saturation of the soft magnetic core and, if the two current sheets are brought too close together their magnetic fields will tend to cancel.

Figure 4:
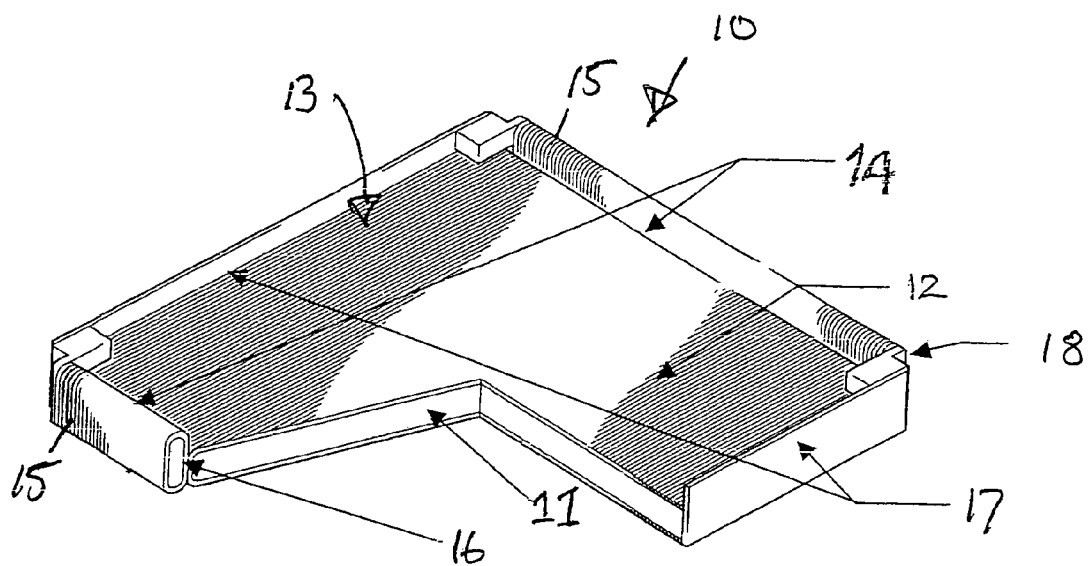
FIG. 4 is a cutaway plan view of a magnet assembly of a specific embodiment of the invention.

Turning to FIG. 4, the applicants accordingly propose a magnetic assembly, generally indicated at 10, which includes a rectangular magnetically soft core 11 carrying windings 12, which together form the main planar electromagnet, generally indicated at 13. Immediately adjacent the edges of the magnet 13 are placed auxiliary coils 14. These are each formed from windings 15 wound about oblate cores 16 and it will be noted that they project upwardly above the upper surface of the planar magnet 13. Pole pieces 17 are attached to the ends of the planar magnet 13 and these too project above the upper surface of the planar magnet 13. Finally the assembly is completed by mounting brackets 18.

Figure 6:
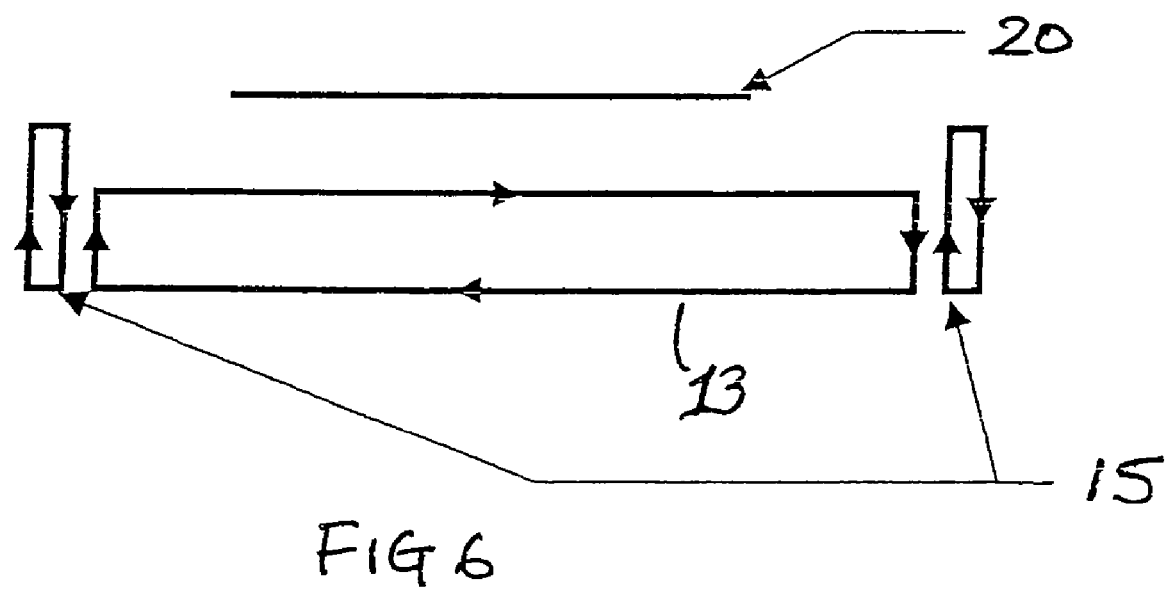
FIG. 6 is the equivalent diagram to FIG. 3 for the construction of FIG. 4.

Turning now to FIG. 6, it will be seen that the inner vertical limbs of auxiliary coils 15 have oppositely flowing current to the current flowing in the respective adjacent edge 19 of the planar magnet 13. Thus one way of considering the arrangement of FIG. 4 is that the magnetic fields in the auxiliary windings serve to compensate for the edge effects. It may be possible to achieve this by auxiliary coils which do not project. However, another way of viewing the FIG. 4 construction is that it is the magnetic equivalent of an electromagnet having U-shaped windings and therefore produces a uniform magnetic field parallel to the upper surface of the electromagnet 13 and between the arms formed by the projecting portions of the auxiliary coils 15. Accordingly if the substrate 20 can sit in the vicinity of these upwardly projecting arms, it will lie in an aligned field.

This notable improvement is well illustrated by comparing FIGS. 7 and 8. As has been mentioned above the FIG. 7 field is generated from the arrangement illustrated in FIG. 3. The outside edge of a wafer or substrate 20 is indicated at 21 and it will be seen that there is an area of poor alignment. (As only a quadrant is shown, corresponding patches will also appear on the corresponding portions in the other quadrant). In contrast, in FIG. 8, the field is well aligned over all of the surface of the substrate 20.

Figure 5:
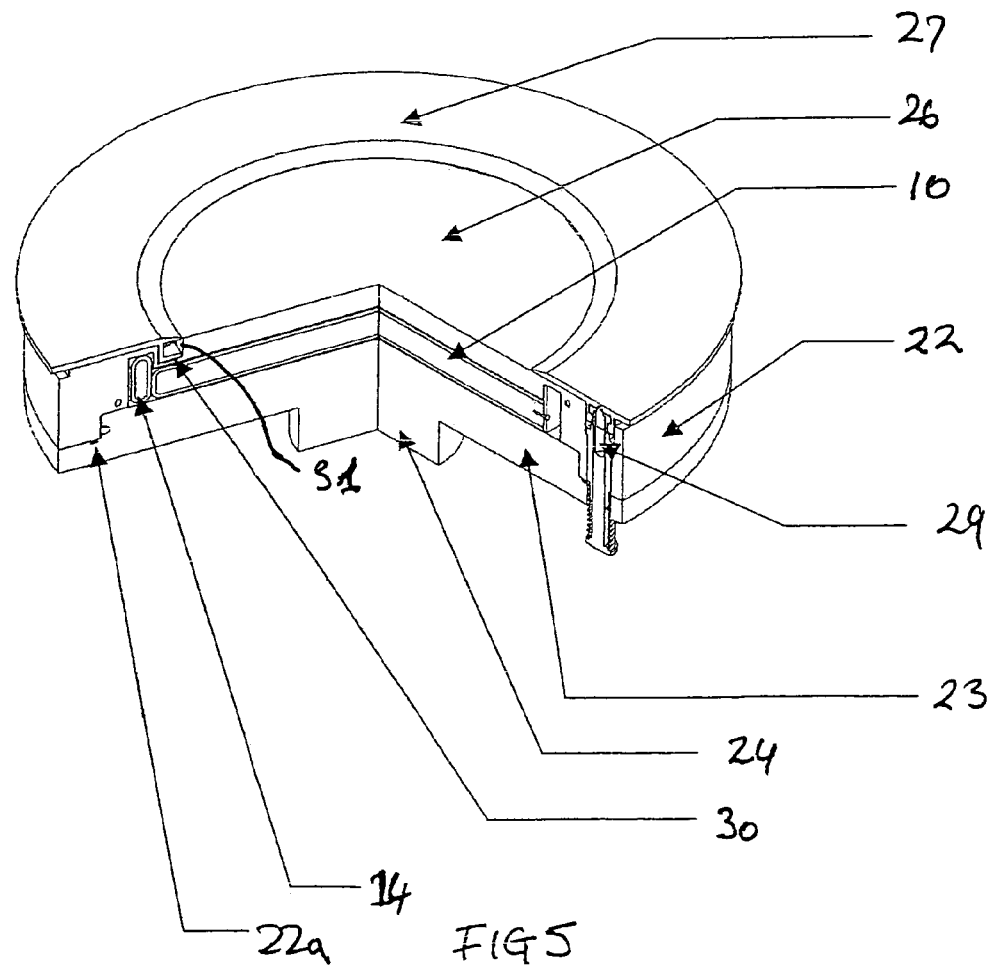
FIG. 5 is a cutaway view showing the assembly mounted in a wafer support.

FIG. 5 illustrates how the assembly 10 can be located into a practical support arrangement. Thus an enclosure is formed by upper and lower plates 22, 23 which seal around the periphery, at 22a, to form a vacuum tight enclosure. The enclosure is intended to be mounted within a vacuum process chamber, by means of the stem 24 on the lower enclosure plate 23 such that a vacuum exists outside of the enclosure and normal atmosphere exists on the inside. The atmospheric region connects to the outside of the process chamber by means of penetrations 25 (not shown) in the stem as is well known in the art. The central region of the top surface of the upper enclosure plate forms the support surface 26 for the wafer or substrate 20. This is the region where the magnetic field needs to be projected. Above the upper plate 20 is the edge shield 27. This protect the exposed part of the upper plate 22 from the deposition of flux during the process. The edge shield 27 has a central aperture 28 which is sized slightly smaller than the substrate 20 in order to protect the edges of the substrate from deposition. The edge ring is support on three actuators 29 which can cause the edge ring to move vertically during wafer loading and unloading operations. Four wafer lift fingers 30 are mounted to the lower face of the edge shield 27. During processing the edge shield 27 is in the fully down position and the fingers 30 are accommodated within pockets 31 in the enclosure upper plate. After processing the edge shield is raised, thereby picking the substrate 20 off the support surface 26 by means of the lift fingers. A substrate handling robot (not shown) then removes the substrate from the support fingers and replaces it by a fresh wafer. The edge shield 27 is then lowered so as to place the new substrate down onto the support surface 26. The assembly 10 is mounted on the lower enclosure plate 23, as shown. Electrical connections are brought out via penetrations in the stem 24 of the lower plate 23. The upper and lower plates 22, 23 are both water cooled in order to remove heat generated by the coils and also heat transferred from the wafer during processing. The cooling water likewise passes through the penetrations within the stem.

The planar coil 12 typically processes approximately a thousand turns of copper wire and requires a current of approximately 2 A to produce a magnetic field at the wafer support of 5,000 A.m$^{-1}$. The auxiliary coils 14 also possess a thousand turns and also typically run at 2 A in order to provide good field alignment. Field and non-uniformity over the wafer support surface is maintained with in +/−5% and alignment is within +/−2°.

One advantage of the Applicants' system is that it achieves this high level performance without being significantly larger than the substrate. Thus useful results have been achieved with an assembly measuring 350 mm×326 mm for a 300 mm circular substrate.

What is claimed is:

1. A magnetic assembly comprising:
an electromagnet which includes windings wound about a generally planar body, the generally planar body including opposite first and second side surfaces and opposite first and second principal planar surfaces extending between the opposite first and second side surfaces, wherein the windings cross over the opposite first and second principal surfaces and the opposite first and second side surfaces of the planar body; and a pair of auxiliary coils spaced from the electromagnet and lying in a same plane as the planar body of the electromagnet, wherein the pair of auxiliary coils are respectively disposed adjacent to and along the opposite side surfaces of the planar body of the electromagnet such that the planar body of the electromagnet is located between the pair of auxiliary coils, wherein a portion of each of the pair of auxiliary coils projects beyond the first principal planar surface of the electromagnet.

2. An assembly as claimed in claim 1 further including one or more power supplies for supplying current to the electromagnet and the auxiliary coils so that the current flows in opposite directions in the adjacent sections of the windings of the electromagnet and the respective auxiliary coils.

3. An assembly as claimed in claim 2 wherein the coils and electromagnet are independently powered.

4. An assembly as claimed in claim 1 including means for tuning the auxiliary coils.

5. An assembly as claimed in claim 4 wherein the tuning means includes one or more tapping points for altering the active number of windings in the respective coils.

6. An assembly as claimed in claim 4 wherein the tuning means includes means for varying the current through the respective coils.

7. The magnetic assembly of claim 1, wherein the electromagnetic and the pair of auxiliary coils generate the magnetic equivalent of an electromagnet having a U-shaped winding.

8. The magnetic assembly of claim 1, wherein electromagnetic and the pair of auxiliary coils generate a uniform magnetic field extending between the auxiliary coils and parallel to the first principal surface of the electromagnet.

9. The apparatus as claimed in claim 1, wherein the windings of the electromagnet extend in a direction between the pair of auxiliary coils, and wherein the auxiliary coils includes winding extending parallel to the windings of the electromagnet.

10. Planar workpiece processing apparatus comprising:
a vacuum chamber;
a support for a workpiece located in the chamber to support the workpiece in a generally planar workpiece location; and
a magnetic assembly which includes an electromagnet and auxiliary coils which generate a uniform magnetic field extending between the auxiliary coils and parallel to a base of the generally planar workpiece support;
wherein the electromagnet includes windings wound about a generally planar body located below the support, the electromagnet including a generally planer principal surface extending between opposite sides of the electromagnet; and
wherein the auxiliary coils include a pair of auxiliary coils disposed adjacent the opposite sides of the electromagnet such that the electromagnet is located between the pair of auxiliary coils and such that the pair of auxiliary coils project above the principal surface of the electromagnet.

11. The apparatus as claimed in claim 10, wherein the windings of the electromagnet extend in a direction between the pair of auxiliary coils, and wherein the auxiliary coils includes winding extending parallel to the windings of the electromagnet.

* * * * *